United States Patent
Shih et al.

[11] Patent Number: 6,153,526
[45] Date of Patent: Nov. 28, 2000

[54] METHOD TO REMOVE RESIDUE IN WOLFRAM CMP

[75] Inventors: Tsu Shih, Hsin-chu; Jih-Churng Twu, Chung-Ho, both of Taiwan

[73] Assignee: Taiwan Semiconductor Manufacturing Company, Hsin-Chu, Taiwan

[21] Appl. No.: 09/320,758

[22] Filed: May 27, 1999

[51] Int. Cl.[7] .................................................. H01L 21/00
[52] U.S. Cl. .......................... 438/692; 216/38; 216/88; 438/745; 438/754; 438/756
[58] Field of Search .................... 438/691, 692, 438/693, 745, 747, 748, 754, 756; 216/38, 88, 89

[56] References Cited

U.S. PATENT DOCUMENTS

| | | | |
|---|---|---|---|
| 5,244,534 | 9/1993 | Yu et al. .................................... | 156/636 |
| 5,314,843 | 5/1994 | Yu et al. .................................... | 437/225 |
| 5,356,513 | 10/1994 | Burke et al. ........................ | 438/692 X |
| 5,502,008 | 3/1996 | Hayakawa et al. .................. | 438/692 X |
| 5,688,360 | 11/1997 | Jairath ...................................... | 156/345 |
| 5,726,099 | 3/1998 | Jaso .......................................... | 438/693 |
| 5,759,917 | 6/1998 | Grover et al. ........................... | 438/690 |
| 5,786,275 | 7/1998 | Kubo ....................................... | 438/692 |
| 5,816,891 | 10/1998 | Woo ........................................... | 451/6 |
| 5,854,129 | 12/1998 | Sandhu et al. ....................... | 438/692 X |

*Primary Examiner*—William Powell
*Attorney, Agent, or Firm*—George O. Saile; Stephen B. Ackerman

[57] ABSTRACT

A new method for removing particle residue from the surface of semiconductor wafers that contain wolfram plugs. A series of polishing and buffing steps is performed; the first of this is a wolfram CMP using a hard polishing pad. An oxide buffing operation is further performed on the wafer surface; a soft pad is used for this buffing operation. The buffing operation is followed by a wolfram CMP that is applied for a short period of time using a soft polishing pad thereby removing the protruding top of the wolfram plug and the oxide particles from the vicinity of the wolfram plugs.

37 Claims, 2 Drawing Sheets

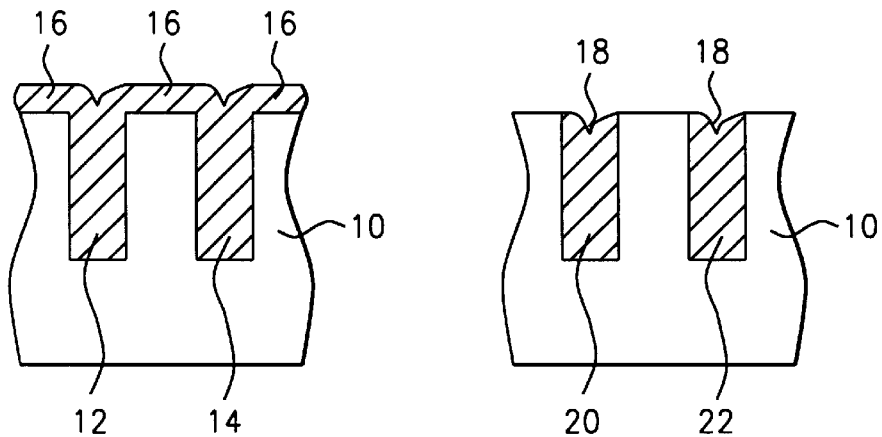
FIG. 1 – Prior Art
FIG. 2 – Prior Art
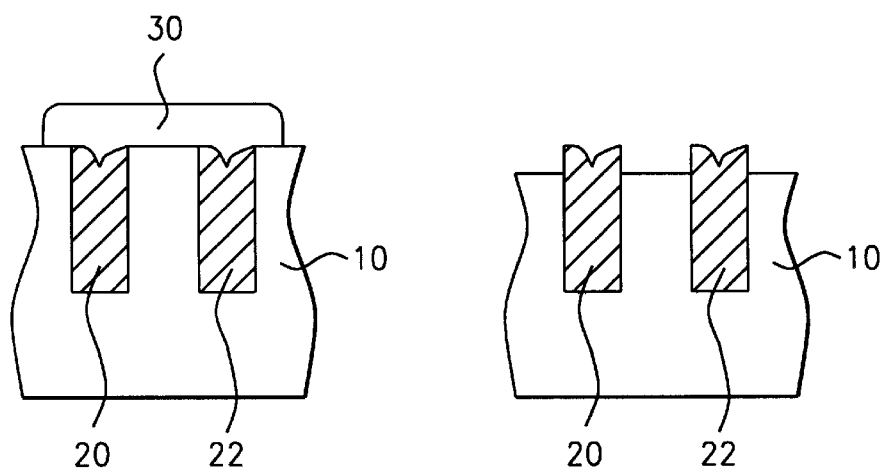
FIG. 3 – Prior Art
FIG. 4 – Prior Art

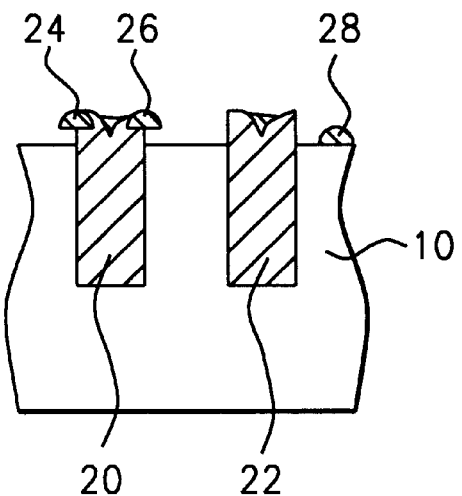
*FIG. 5 − Prior Art*
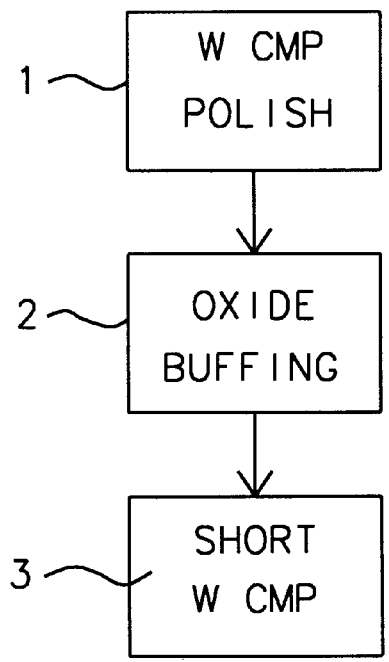
*FIG. 6*

METHOD TO REMOVE RESIDUE IN WOLFRAM CMP

BACKGROUND OF THE INVENTION (1) Field of the Invention

The invention relates to the fabrication of semiconductor integrated circuit devices, and more specifically to a method of avoiding oxide residue after wolfram plug CMP oxide buffing.

(2) Description of the Prior Art

The invention relates to the field of Chemical Mechanical Polishing (CMP) of a semiconductor surface that contains wolfram plugs. More particularly, the present invention relates to methods for chemical mechanical polishing of substrates that contain wolfram plugs, such as semiconductor substrates, on a rotating polishing pad in the presence of a chemically and/or physically abrasive slurry, and providing fresh supply of slurry onto the surface of the substrate which is mounted on the polishing pad while the substrate is being polished.

U.S. Pat. No. 5,688,360 teaches that, during VLSI fabrication, meticulously clean silicon wafers are critical for obtaining high yields and suitable performance characteristics of semiconductor devices. Removal of impurities from the wafer surface is important because impurities may diffuse into the semiconductor substrate during subsequent high-temperature processing, altering the substrate bulk and surface properties. Some impurities are donor or acceptor dopants, which directly affect device performance characteristics. Other impurities cause surface or bulk defects such as traps, stacking faults or dislocations. Surface contaminants such as organic matter, oil or grease lead to poor film adhesion. The various types of impurities and contaminants must be removed by careful cleaning, such as chemical or ultrasonic cleaning at initiation of silicon processing and in various appropriate steps during processing.

U.S. Pat. No. 5,688,360 further teaches that silicon processing typically begins with a cleaning step involving wafer scrubbing to remove loose particulate contaminants. Particulates are bits of matter present on a wafer surface that have easily definable boundaries such as various dusts (atmospheric, silicon and quartz), lint, photoresist chunks and bacteria. Particulates are generally removed using a process herein called a cleaning process. Material that is too small to be measurable is herein referenced as 'material', which is generally removed using a polishing process.

Subsequent to a cleaning process, treatment with organic solvents, such as trichloroethylene, acetone, p-xylene, methanol and ethanol, is performed to remove organic impurities such as hydrocarbons and greases, which remain from a prior wafer-grinding process. A final cleaning includes treatment with several various inorganic chemicals to remove heavy metals, for example. These inorganic chemical mixtures are strong oxidants, which form a thin oxide layer at the wafer surface. This oxide layer is stripped, removing impurities absorbed into the oxide layer.

Chemical cleaning for removing chemically bonded film from wafer surface is one step in a cleaning process. Conventional chemical cleaning includes a series of acid and rinse baths.

For a typical CMP procedure, a polishing pad is pressed under high pressure against the wafer that is being polished. The polishing pad can be made of a synthetic material, polishing slurry is used to enhance and activate the polishing action. The polishing slurry typically contains pH-balanced chemicals, such as sodium hydroxide, and silicon dioxide particles. The fixture in which the wafer is mounted during the polishing operation rotates whereby the polishing pads is in direct physical contact with the wafer that is being polished. This direct contact combined with the frictional interaction between the wafer and the polishing pad create an abrasive action on the surface of the wafer that is being polished while the pH of the polishing slurry controls the chemical reactions of the chemicals that are contained in the insulating layer of the wafer. The polishing of the wafer is accomplished when the silicon dioxide particles abrade away the oxidized chemicals.

One factor, which contributes to the unpredictability and non-uniformity of the polishing rate of the CMP process, is the non-homogeneous replenishment of slurry at the surface of the substrate and the polishing pad. The slurry is primarily used to enhance the rate at which selected materials are removed from the substrate surface. As a fixed volume of slurry in contact with the substrate reacts with the selected materials on the surface of the substrate, this fixed volume of slurry becomes less reactive and the polishing enhancing characteristics of that fixed volume of slurry is significantly reduced. One approach to overcoming this problem is to continuously provide fresh slurry onto the polishing pad.

Specifically, applying the CMP process to Intra Level Dielectric (ILD) and Inter Metal Dielectric (IMD) that are used for the manufacturing of semiconductor wafers, surface imperfections (micro-scratch) typically present a problem. Imperfections caused by micro-scratches in the ILD and IMD can range from 100 to 1000 EA for 200 mm. wafers, where an imperfection typically has a depth from 500 to 900 $A^0$ and a width of from 1000 to 3000 $A^0$. As part of the polishing process of the ILD and IMD, a tungsten film is deposited; the surface imperfections will be filled with tungsten during this deposition. For devices within the semiconductor wafer with a dimension of 0.35 um. or larger, an etching process is used where the tungsten that has entered the imperfections within the wafer surface can be removed. For the larger size devices within the semiconductor wafer there is therefore no negative impact on the yield of these devices. For device sizes within the semiconductor wafer of 0.25 um or less, the indicated procedure of etching the tungsten layer is no longer effective. This results in relative large imperfections within the surface of the wafer, large with respect to the size of the semiconductor devices. These imperfections will cause shorts between the metal lines within the devices while the imperfections also have a severe negative impact on device yield and device reliability.

As part of the CMP process, oxide slurry can also be used. P typical CMP process uses only one polishing pad, this pad being a, hard polishing pad, for instance an IS 1000 pad. In polishing a semiconductor surface wherein wolfram plugs have been created as part of the damascene process, it is found that the plug protrudes from the semiconductor surface by about 1000 Angstrom, this protrusion will have an impact on the polishing process since the plug protrusion interrupts the constant and uniform contact between the polishing pad and the surface of the semiconductor wafer. From this it is readily apparent that oxide slurry will not be uniformly removed from the immediate vicinity of the wolfram plug and that a body of oxide slurry will accumulate near the plug. A particle count of in excess of 5000 EA has been observed in such an environment. It is the objective of the present invention to reduce this particle count in the immediate vicinity of the wolfram plug.

FIGS. 1 through 5 show the results obtained in Prior Art polishing of a semiconductor surface that contains wolfram plugs. FIG. 1 shows wolfram plugs 12 and 14 that have been created in a semiconductor substrate 10. The surface of layer 16 is polished, the results of this polishing process are shown in FIG. 2. Plugs 20 and 22 (FIG. 2) show the formation of keyholes 18, these keyholes result in poor planarization of the semiconductor surface. To remedy this poor planarization, the top of the wolfram plugs 20 and 22 is removed. This is done by first using film 30 of oxide slurry 30, FIG. 3, over the surface of the substrate 10. This oxide slurry, also called Fuse film, is typically between 1000 and 2000 K-Angstrom thick. FIG. 4 shows the results after the process of polishing using the oxide slurry has been completed whereby at the same time the top layer of the surface of the semiconductor is lowered, a total of between about 2K and 4K Angstrom is removed. FIG. 4 shows how the tops of plugs 20 and 22 protrude through the surface of substrate 10; the removal of the Fuse film uses $NH_4OH$ and DIW for the removal process. FIG. 4 shows the results of the ideal case of the Fuse film removal, that is the case where no extraneous or loose oxide particles remain after the removal of the Fuse film. FIG. 5 shows the results of an actual case of Fuse film removal, it demonstrates that oxide slurry remains and has accumulated on top of the wolfram plugs, accumulations 24 and 26, and in the immediate vicinity of the wolfram plug, accumulation 28. For the Prior Art case as shown in FIG. 5, an oxide film of about 1 kAngstrom thickness will form on the surface of the wolfram plugs, this in addition to the indicated accumulation of the oxide slurries of 24, 26 and 28. In the case that is illustrated by FIG. 5, a defect count in the area of the wolfram plugs in excess of 5000 EA is consistently observed.

U.S. Pat. No. 5,244,534 (Yu et al.) shows a 2 step CMP process for W plugs. Yu appears to shows steps (1) and (2) of the invention. This is close to the invention.

U.S. Pat. No. 5,786,275 (Kubo) teaches a 2-step W CMP process. Kubo changes polishing conditions such as speed and slurry composition. Kubo does not appear to show the invention's (3).

U.S. Pat. No. 5,816,891 (Woo) teaches a CMP oxide and metal process/tool that has multiple pads and slurries.

U.S. Pat. No. 5,726,1099 (Jaso) shows a W CMP using ammonium Persulfate slurry.

U.S. Pat. No. 5,314,843 (Yu et al.) teaches a W CMP process.

U.S. Pat. No. 5,759,917 (Grover) shows an oxide CMP slurry.

SUMMARY OF THE INVENTION

A principle objective of the present invention is to reduce particle residue from wafer surfaces after wolfram CMP process.

Another objective of the present invention is to improve semiconductor wafer throughput using the wolfram CMP process for semiconductor wafer surfaces that contain wolfram plugs.

Another objective of the present invention is to reduce shorts between metal lines within the devices contained within a semiconductor wafer that contains wolfram plugs.

Another objective of the present invention is to improve reliability of the devices contained within a semiconductor wafer that contains wolfram plugs.

Yet another objective of the present invention is to reduce oxide film on the surface of wolfram plugs in a semiconductor wafer.

Yet another objective of the present invention is to enhance the use and applicability of oxide slurry deposition as part of the process of semiconductor wafer wolfram CMP.

Yet another objective of the present invention is to enable reduction of semiconductor device dimensions to the quarter-micro range for semiconductor devices that are created using semiconductor surfaces that contain wolfram plugs.

Yet another objective of the present invention is to enhance the removal of oxide damascene residue during semiconductor wafer polishing.

In accordance with the objectives of the invention, a new method for removing particle residue from the surface of semiconductor wafers that contain wolfram plugs is achieved. A series of polishing and buffing steps is performed, the first of this is a wolfram CMP using a hard polishing pad. During this hard pad polish operation the surface of the intra-level oxide dielectric is over-polished, that is it is lowered to below the top of the wolfram plug within the semiconductor surface. An oxide buffing operation is further performed on the wafer surface, this oxide buffing operation removes the surface oxide from the intra-level dielectric layer of oxide that surrounds the wolfram plug and reduces micro-scratch within that oxide surface. A soft pad is used for this buffing operation; the wolfram plug now protrudes from the surface of the substrate while oxide particle count in the immediate vicinity of the wolfram plug is high. These latter two conditions are eliminated by a wolfram CMP that is applied for a short period of time, this short time W CMP removes the protruding top of the wolfram plug and it removes the oxide particles from the vicinity of the wolfram plugs.

To summarize:

a WCMP polish to remove the top surface of the deposited wolfram, using a hard polishing pad oxide buffing to remove micro-scratch from the surface of the intra-level oxide dielectric short time W CMP to remove the protruding top of the wolfram plug and the oxide particles in the vicinity of the wolfram plug, using a soft polishing pad.

BRIEF DESCRIPTION OF THE DRAWINGS

FIG. 1 shows a cross section of a semiconductor wafer wherein wolfram damascene plugs have been created.

FIG. 2 shows the results of the Prior Art CMP of the surface of the semiconductor wafer.

FIG. 3 shows the Prior Art deposition of a slurry film prior to CMP of the surface of the semiconductor wafer.

FIG. 4 shows the ideal results of CMP of the surface of the semiconductor wafer.

FIG. 5 shows the actual Prior Art results of the CMP of the surface of the semiconductor wafer.

FIG. 6 shows the four step polishing procedure of the invention.

DESCRIPTION OF THE PREFERRED EMBODIMENT

Referring now more particularly to FIG. 6, there is shown the three step polishing procedure of the invention.

FIG. 6 step 1 indicates the first polishing process of the invention, that is the wolfram CMP. During this polishing action, wolfram slurry is deposited on the surface that contains wolfram plugs thereby including the wolfram plugs. The polishing pad used for this polish is a hard pad such as a commercially available IC1000 or its equivalent in chemical and/or mechanical abrasive polishing action. During the Wolfram CMP process, $SiO_2$, $H_2O_2$, $WO_x$ and other chemical components may be created that have an abrasive effect on the surface that is being polished. This W CMP polish typically removes about 1300 Angstrom from the surface of the layer of wolfram that has been deposited on the surface of the semiconductor wafer. After the W CMP, the number of micro-scratches, caused by the abrasive effect of $SiO_2$, $H_2O_2$, $WO_x$ and other chemical components is typically within the range between 100 and 1000 micro-scratches per unit of surface of the intra-level dielectric.

The W CMP typically uses a hard pad such as an IC 1000 pad, made of polyurethane. The slurry used for the W CMP has a pH of between about 2 and 4 with a W/oxide slurry selectivity in excess of 100 and a slurry removal rate of between about 2000 and 7000 Angstrom per minute.

FIG. 6 step 2 indicates the second polishing step of the invention, that is the oxide buffing to remove micro-scratch from the surface of the intra-level oxide dielectric. During this buffing action, an oxide slurry is used to polish oxide, $SiO_2$, KOH and possibly other oxide derivatives. The pad used for this buffing step is a soft pad. This buffing typically reduces the number of micro-scratches to the range between 40 and 100 scratches per unit of surface of the intra-level dielectric. At the end of this buffing step the wolfram plug protrudes above the surface of the intra-level dielectric while oxide particle count in the immediate vicinity of the wolfram plug is high. The oxide by-products are formed in the slurry, due to the protruding surface of the Wolfram plug the slurry residue readily accumulates around and in the immediate vicinity of the surface of the Wolfram plug. The pad used for the buffing operation is a soft pad, made of polyurethane with the duration of the buffing operation between about 5 and 30 seconds.

FIG. 6 step 3 indicates the third polishing process of the invention, that is short time W CMP to remove the protruding top of the wolfram plug and the oxide particles in the vicinity of the wolfram plug, using a soft polishing pad. During this polishing action, Wolfram slurry is again deposited on the surface of the semiconductor wafer. The W CMP process removes wolfram at a slower rate than oxides. The polishing pad used for this polish is a soft pad, typically a polytex pad or its equivalent in chemical and/or mechanical abrasive polishing action. The Wolfram slurry used for this polish removes oxide or oxide derivatives. Prior Art applies a rf cleaning process to remove oxide by-products that are present in the slurry. This approach however causes a sidewall etch of the barrier layer of Ti or TiN that is typically formed in the opening in which the Wolfram plug is formed. The short W CMP operation uses a soft pad, made of polyurethane, the slurry used for the short W CMP is $H_2O_2$ and silicon based with a slurry pH of between about 2 and 4.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for removing Chemical Mechanical Polishing residue from the surface of semiconductor wafers said semiconductor wafers containing wolfram damascene plugs, which method comprises:

applying a first polishing procedure to the surface of said semiconductor substrate;

applying a buffing procedure to the surface of said semiconductor substrate; and applying a second polishing procedure to the surface of said semiconductor substrate.

2. The method of claim 1 wherein said fist polishing procedure is:

applying a first pressurized spray of slurry to the surface of the polishing pad; and applying a first chemical mechanical polishing to the surface of said semiconductor to substantially remove silica from the surface of said semiconductor substrate thereby including the top surface of said wolfram plug.

3. The method of claim 2 wherein said first CMP applies a non-fibrous polyurethane polishing pad.

4. The method of claim 2 wherein said first CMP applies a cellular polyurethane polishing pad.

5. The method of claim 2 wherein said first CMP applies a molded polyurethane polishing pad.

6. The method of claim 2 wherein said first CMP applies a microporous blown polyurethane material having a planar surface and a Shore D hardness of greater than 35.

7. The method of claim 2 wherein said first CMP applies a commercially available polishing pad.

8. The method of claim 2 wherein said slurry of said first pressurized spray of slurry contains wolfram.

9. The method of claim 2 wherein said slurry of said first pressurized spray of slurry contains wolfram whereby said wolfram slurry is applied to remove $Si_2O$ particles of a size of less than 200 nm whereby further $H_2O_2$ is added to said slurry whereby the weight of said $H_2O_2$ is within the range of between about 1 and 6 percent of the total slurry weight.

10. The method of claim 1 wherein said slurry has a pH value of 2.5 and a polishing rate in excess of 2000 Angstrom per minute.

11. The method of claim 1 wherein said buffing procedure is an oxide buffing procedure said buffing procedure applying a soft buffing pad to the surface of said semiconductor to substantially remove micro-scratch from the surface of said semiconductor substrate thereby including the top surface of said wolfram plug.

12. The method of claim 1 wherein said second polishing procedure is:

applying a second pressurized spray of slurry to the surface of the polishing pad; and applying a second chemical mechanical polishing to the surface of said semiconductor to complete the removal of silica and slurry remnants from the surface of said semiconductor substrate thereby including the top surface of said wolfram plug.

13. The method of claim 12 wherein said second CMP applies a polytex polishing pad.

14. The method of claim 12 wherein said second CMP applies a soft polishing pad whereby furthermore said second CMP is applied over a period of time within the range between about 3 and 15 seconds.

15. The method of claim 12 wherein said slurry of said second pressurized spray of slurry contains wolfram.

16. A method for sequentially polishing a plurality of semiconductor wafers said semiconductor wafers containing wolfram damascene plugs, which method comprises:

applying a first pressurized spray of slurry to the surface of the polishing pad;

applying a first chemical mechanical polishing to the surface of said semiconductor to substantially remove silica from the surface of said semiconductor substrate thereby including the top surface of said wolfram plug;

applying a buffing to the surface of the polishing pad;

applying a second pressurized spray of slurry to the surface of the polishing pad; and applying a second chemical mechanical polishing to the surface of said semiconductor to substantially remove silica from the surface of said semiconductor substrate thereby including the top surface of said wolfram plug.

17. The method of claim 16 wherein said first CMP applies a non-fibrous woven polyurethane polishing pad.

18. The method of claim 16 wherein said first CMP applies a cellular polyurethane polishing pad.

19. The method of claim 16 wherein said first CMP applies a molded polyurethane polishing pad.

20. The method of claim 16 wherein said slurry of said first pressurized spray of slurry contains wolfram.

21. The method of claim 16 wherein said slurry of said second pressurized spray of slurry contains wolfram whereby furthermore said second CMP is applied over a period of time within the range between about 3 and 15 seconds.

22. A method for creating a conductive plug in an insulating layer, comprising the steps of:

providing a semiconductor substrate;

depositing an insulating layer on the surface of said semiconductor substrate;

removing a portion of said insulating layer to form a contact hole within said insulating layer;

depositing a layer of conductive material on top of said insulating layer, filling said contact hole with said conductive material and resulting in a layer of said conductive material over the surface of said insulating layer;

removing at least a portion of said conductive material from said surface of said insulating material, leaving said contact hole substantially filled with said conductive material, said removing being performed by chemical mechanical polishing with a slurry comprising an abrasive component and an oxidizing components said oxidizing component comprising silicon dioxide and hydrogen dioxide wherein the ratio by volume of silicon dioxide to hydrogen dioxide is in a range between from about 1:0 to 1:1;

performing a first polish of said insulating layer to lower said insulating layer surface with respect to an upper surface of said conductive material;

performing a buffing operation of said insulating layer thereby including the top surface of said conductive plug; and performing a short term polishing operation of said insulating layer, including the top surface of said conductive plug.

23. The method of claim 22 wherein said contact hole is formed by etching.

24. The method of claim 22 wherein said conductive layer is formed by chemical vapor deposition.

25. The method of claim 22 wherein said abrasive material contains wolfram.

26. The method of claim 22 wherein said removing a portion of said insulating layer is done by chemical mechanical polishing.

27. The method of claim 22 wherein said performing a first polish of said insulating layer comprises the use of a slurry said slurry having an abrasive material and a compound which selectively removes a portion of the insulating layer whereby furthermore a hard polishing pad is applied.

28. The method of claim 27 wherein said abrasive material comprises wolfram.

29. The method of claim 27 wherein said compound comprises Silicon dioxide and hydrogen dioxide.

30. The method of claim 22 wherein between 0.5 kAngstrom and 3.0 kAngstrom is removed during said step of performing a first polish of said insulating layer.

31. The method of claim 22 wherein said performing a first polish of said insulating layer continues until said insulating layer surface is substantially even with the upper surface of said conductive plug.

32. The method of claim 22 wherein said conductive plug comprises wolfram.

33. The method of claim 22 wherein said insulating layer comprises an insulating dielectric layer.

34. The method of claim 22 wherein said performing a buffing operation of said insulating layer is an oxide buffing operation said step of performing a buffing operation of said insulating layer to continue until the surface of said insulating layer is lower than said upper surface of said conductive plug thereby resulting in said conductive plug protruding from the surface of said insulating layer.

35. The method of claim 22 wherein said performing a short term polishing operation of said insulating layer is a short term wolfram polishing operation thereby planarizing said protruding top surface of said conductive plug thereby furthermore removing remaining oxide slurry residue from the surface of said insulating layer.

36. The method of claim 22 whereby said insulating material comprises polyimide.

37. The method of claim 22 whereby said insulating material comprises a polymer.

* * * * *